(12) United States Patent
Gupta et al.

(10) Patent No.: US 8,516,411 B2
(45) Date of Patent: Aug. 20, 2013

(54) REGISTER TRANSFER LEVEL DESIGN COMPILATION ADVISOR

(75) Inventors: Sanjay Gupta, Nioda (IN); Charles W. Selvidge, Wellesley, MA (US); Praveen Shukla, Allahabad (IN)

(73) Assignee: Mentor Graphics Corporation, Wilsonville, OR (US)

( * ) Notice: Subject to any disclaimer, the term of this patent is extended or adjusted under 35 U.S.C. 154(b) by 205 days.

(21) Appl. No.: 13/017,929

(22) Filed: Jan. 31, 2011

(65) Prior Publication Data

US 2012/0180011 A1 Jul. 12, 2012

Related U.S. Application Data

(60) Provisional application No. 61/431,426, filed on Jan. 10, 2011.

(51) Int. Cl.
*G06F 9/45* (2006.01)
*G06F 17/50* (2006.01)

(52) U.S. Cl.
USPC ............ 716/103; 716/101; 716/104; 716/106

(58) Field of Classification Search
USPC .................................. 716/101, 103, 104, 106
See application file for complete search history.

(56) References Cited

U.S. PATENT DOCUMENTS

| 5,541,849 | A  | * | 7/1996  | Rostoker et al. | 716/102 |
|-----------|----|---|---------|-----------------|---------|
| 5,553,002 | A  | * | 9/1996  | Dangelo et al.  | 716/102 |
| 5,555,201 | A  | * | 9/1996  | Dangelo et al.  | 716/102 |
| 6,292,931 | B1 | * | 9/2001  | Dupenloup       | 716/104 |
| 6,295,636 | B1 | * | 9/2001  | Dupenloup       | 716/103 |
| 6,438,735 | B1 | * | 8/2002  | McElvain et al. | 716/103 |
| 6,601,024 | B1 | * | 7/2003  | Chonnad et al.  | 703/14  |
| 6,668,364 | B2 | * | 12/2003 | McElvain et al. | 716/103 |
| 7,076,472 | B2 | * | 7/2006  | Addison         | 706/13  |
| 7,237,214 | B1 | * | 6/2007  | Pandey et al.   | 716/131 |
| 7,454,732 | B2 | * | 11/2008 | McElvain et al. | 716/125 |
| 7,509,246 | B1 | * | 3/2009  | Molson et al.   | 703/13  |
| 7,735,050 | B2 | * | 6/2010  | Yu et al.       | 716/104 |
| 7,971,104 | B2 | * | 6/2011  | Dolev et al.    | 714/55  |
| 8,176,452 | B2 | * | 5/2012  | Pandey et al.   | 716/105 |

* cited by examiner

*Primary Examiner* — Sun Lin

(57) ABSTRACT

Techniques and tool for selecting compilation parameter values for compiling a first description of a circuit design, such as a register transfer language description, into a second description of the circuit design, such as a model description for implementation with an emulator are provided. According to various examples of the invention, a compilation tool "elaborates" the first description of the circuit design into a third description for the circuit design. Typically, the third description or "elaboration" will cross one or more hierarchical boundaries represented in the first description of the circuit design, so that the elaboration will represent at least a portion of two or more hierarchical modules in the first description design according to a non-hierarchical or "flat" manner. Also, with some implementations of the invention, the elaboration may include only a simple representation of a corresponding portion of the circuit design.

12 Claims, 8 Drawing Sheets

REGISTER TRANSFER LEVEL DESIGN COMPILATION ADVISOR

RELATED APPLICATION

The present application claims priority under 35 U.S.C. §119(e) to U.S. Provisional Patent Application No. 61/431,426, entitled "Register Transfer Level Design Compilation Advisor," filed on Jan. 10, 2011 and naming Selvidge et al. as inventors, which application is incorporated entirely herein by reference.

FIELD OF THE INVENTION

The present invention is directed to the compilation of circuit designs containing circuit elements with a high level of abstraction into circuit designs containing circuit elements with a lower level of abstraction. Various implementations of the invention may be particularly useful for compiling a circuit design defined using a register transfer level language into a circuit design containing primitive circuit elements for implementation in an emulator.

BACKGROUND OF THE INVENTION

Electronic circuits, such as integrated circuits, are used in a variety of products, from automobiles to microwaves to personal computers. Designing and fabricating these circuit devices typically involves many steps, known as a "design flow." The particular steps of a design flow often are dependent upon the type of integrated circuit being designed, its complexity, the design team, and the integrated circuit fabricator or foundry that will manufacture the circuit. Typically, software and hardware "tools" will verify a design at various stages of the design flow by running software simulators and/or hardware emulators, and errors in the design are corrected.

Several steps are common to most design flows. Typically, the specification for the new circuit initially is described at a very abstract level as a logical design. An example of this type of abstract description is a register transfer level (RTL) description of the circuit. With this type of description, the circuit is defined in terms of both the exchange of signals between hardware registers and the logical operations that are performed on those signals. A register transfer level design typically employs a Hardware Design Language (HDL), such as the Very high speed integrated circuit Hardware Design Language (VHDL) or the Verilog language. The logic of the circuit is then analyzed, to confirm that the logic incorporated into the design will accurately perform the functions desired for the circuit. This analysis is sometimes referred to as "functional verification."

In some instances, the functionality of the circuit design will verified by simulating the operation of the design using software. Some designs may be too large or complex to efficiently simulate using software, however. Instead, the functionality of the circuit design will verified by emulating the circuit design using a hardware emulator. Examples of hardware emulators include, for example, the VELOCE family of emulators available from Mentor Graphics Corporation of Wilsonville, Oreg., the ZEBU family of emulators available from EVE SA of Palaiseau, France, and the PALLADIUM family of emulators available from Cadence Design Systems of San Jose, Calif. An emulator typically will provide a set of primitive components for emulating the operation of a circuit design. For example, emulators, some of which may use conventional field-programmable gate array circuits, emulate the functionality of a circuit design using a combination of state elements, memories and lookup tables. Of course, other types of emulators may provide additional or alternate primitive components. For example, alternatively, an emulator may function by using combinatorial elements computing a selectable function over a fixed number of inputs.

Accordingly, before the functionality of a circuit design can be verified with an emulator, the description of the circuit design must be converted or "compiled" into a model of the design that can be implemented using the available primitive components. For example, a VHDL or Verilog description of a circuit design may be converted into a model made up of a combination of state elements, memories, lookup tables, or other primitive elements, which will implement the functionality defined in the design description. A variety of compilation algorithms are known and can be employed to compile HDL circuit design descriptions into the assortment of primitive components provided by different emulators.

Different compilation algorithms may generate different models with different characteristics, however. For example, applying a first algorithm to a portion of a circuit design may produce a model with a relatively small number of primitive components. Applying another algorithm to the same circuit portion may then alternately produce a different model with a larger number of primitive components, but having a smaller operational delay (e.g., a model that more quickly converts an input value to the appropriate output value). Moreover, various design improvement techniques can be employed to modify a model in order to enhance desirable characteristics. For example, retiming techniques may be used to alter a model so as to improve its operational speed. The retiming technique may require adding primitive components to the design, however, increasing its size. Still further, even a single compilation algorithm or design improvement technique may provide different model results depending upon the amount of processing effort applied. For example, applying a few iterations of a compilation algorithm to a circuit design may produce a model with a relatively small operational delay. Applying several more iterations of the same compilation algorithm might then produce a model with an even smaller operational delay.

The various compilation algorithms used to compile a given circuit design region into a model, design improvement techniques and corresponding processing efforts for applying those algorithms and techniques to a design, as well as other compilation variables and options are often referred to as "compilation parameters" or "compilation parameter values." While a designer has a variety of compilation parameter values that can be used to obtain models with desired characteristics, in practice it is difficult for a designer to select an optimal combination of these compilation parameter values. Additionally, a designer typically will not employ a single combination of compilation parameter values. For example, some portions of a circuit design may have critical timing requirements, such that the emulation may not operate efficiently, or even operate correctly, if the corresponding model does not operate at a sufficiently fast speed. Other portions of the design will not have significant critical timing requirements, however. Instead, it may be more important to minimize the size of the model corresponding to these other circuit portions so that, e.g., the entire model can be emulated by a selected portion of an emulator. It therefore is undesirable to use the same combination of compilation parameter values to compile different circuit design portions with varying degrees of timing and size sensitivity.

To add to the complexity of compiling an RTL description of a circuit design into an emulator's primitive components, the design typically will be organized in a hierarchical structure. For example, a design may be made up of "modules," with each module itself containing a description of one or more RTL circuit devices, a reference to one or more lower-level modules, or some combination of both. A module may describe the logic of a frequently-used circuit structure, such as a memory unit. With this arrangement, each occurrence of the memory unit will be represented in the design by a reference to the module, rather than with a detailed description of the circuit logic making up the memory unit. Typically, a specific combination of compilation parameter values will be used to compile a single module into a model, and the compiled model then will be used for each instantiation of the modules in the design. Some instantiations of the modules description may represent timing-critical portions of the circuit design, however, while other instantiations of the module may represent size-critical portions of the circuit design. Further, a significant feature of the circuit, such as a critical timing path, may cross a boundary of two or more modules, making it difficult to apply a single desirable combination of compilation parameter values to that circuit feature.

BRIEF SUMMARY OF THE INVENTION

Aspects of the invention relate to the selection of compilation parameter values for compiling a first description of a circuit design, such as a register transfer language description, into a second description of the design, such as a model description for implementation with an emulator. According to various examples of the invention, a compilation tool "elaborates" a first description of a circuit design into a third description for a circuit design. Typically, the third description or "elaboration" will cross one or more hierarchical boundaries represented in the first description of the design, so that the elaboration will represent at least a portion of two or more hierarchical modules in the first description design according to a non-hierarchical or "flat" manner. Also, with some implementations of the invention, the elaboration may include only a simple representation of the corresponding portion of the circuit design. For example, if the first description will be implemented on an emulator, then the elaboration may describe the primitive components that will be used for the emulation model, along with the interconnections between the primitive components.

With various implementations of the invention, a compilation advisor next analyzes the elaboration to identify compilation variable preferences appropriate for better compiling the first description of the circuit design into the second description of the circuit design. For example, the elaboration may be analyzed to identify critical paths, along with the instances of hierarchical modules in the first description through which those paths travel. The compilation advisor may then select one or more compilation parameter values that can be used to improve the operational delay of those instances of the hierarchical modules in a subsequent compilation process. For example, the compilation advisor according to various implementations of the invention may select the use of a retiming technique to compile those instances of the hierarchical modules in subsequent compilation processes. The compilation parameter values selected by the compilation advisor can then be used for future compilations of the first description of the design.

In some implementations of the invention, the compilation advisor analyzes the elaboration to identify critical capacity regions, along with the instances of hierarchical modules in the first description that encompass those regions. Subsequently, the compilation advisor may select one or more compilation parameter values that may be used to improve the capacity requirements of those instances of the hierarchical modules in a later compilation process for generating the second description. For example, the compilation advisor, according to various implementations, may select to map portions of the first description in the analyzed hierarchical module into dedicated memory logic elements inside the emulator, as opposed to mapping them to a look up table and sequential logic elements within the emulator. With further implementations, the compilation advisor may perform a mutual exclusivity analysis of various read and write operations within the first description to determine which portions to map to dedicated memory logic elements. In still further implementations, the mutual exclusivity analysis may cross hierarchical boundaries within the first description.

DETAILED DESCRIPTION OF THE INVENTION

Example Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
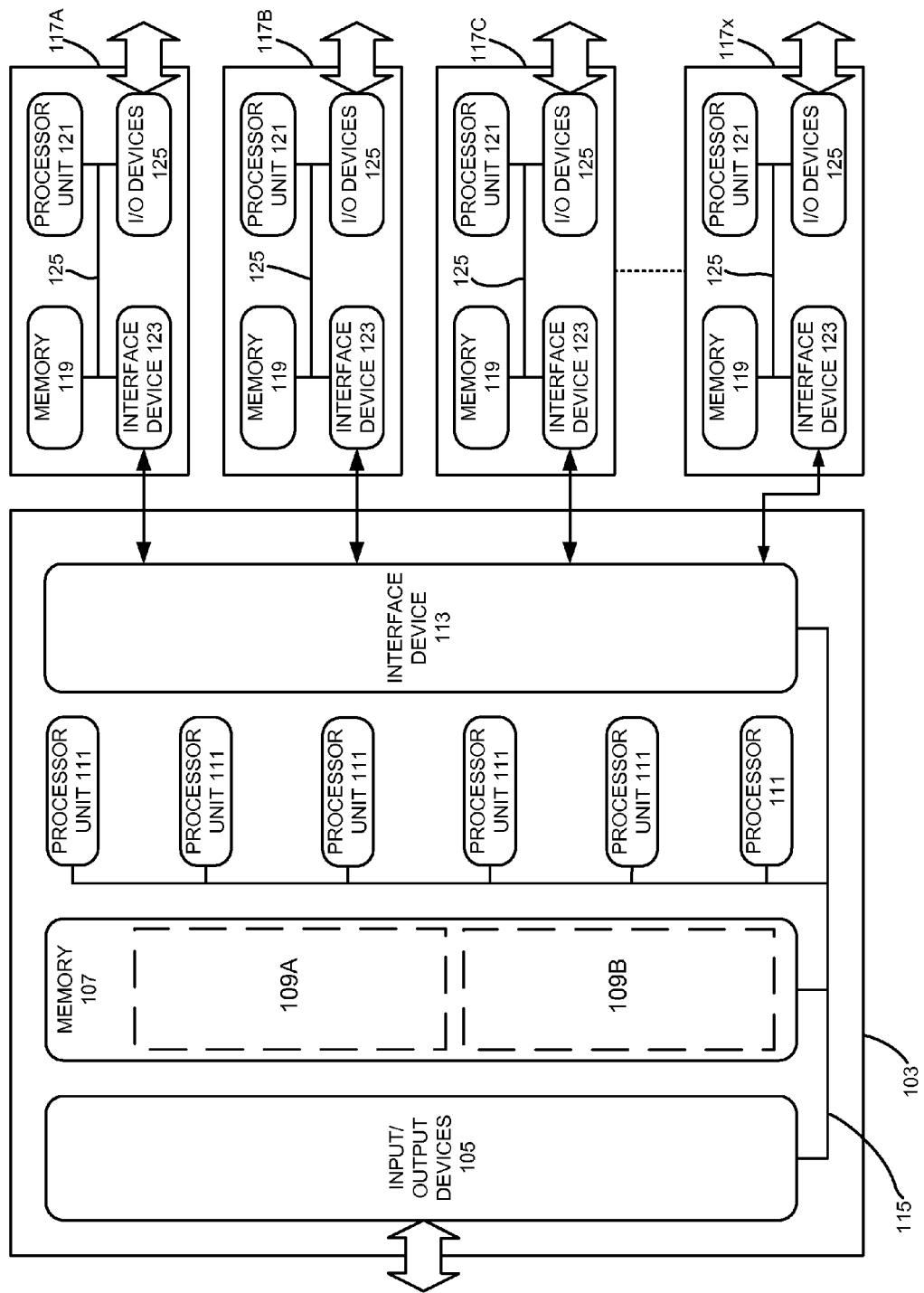
FIGS. 1 and 2 illustrate an example of a computing environment that may be employed to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
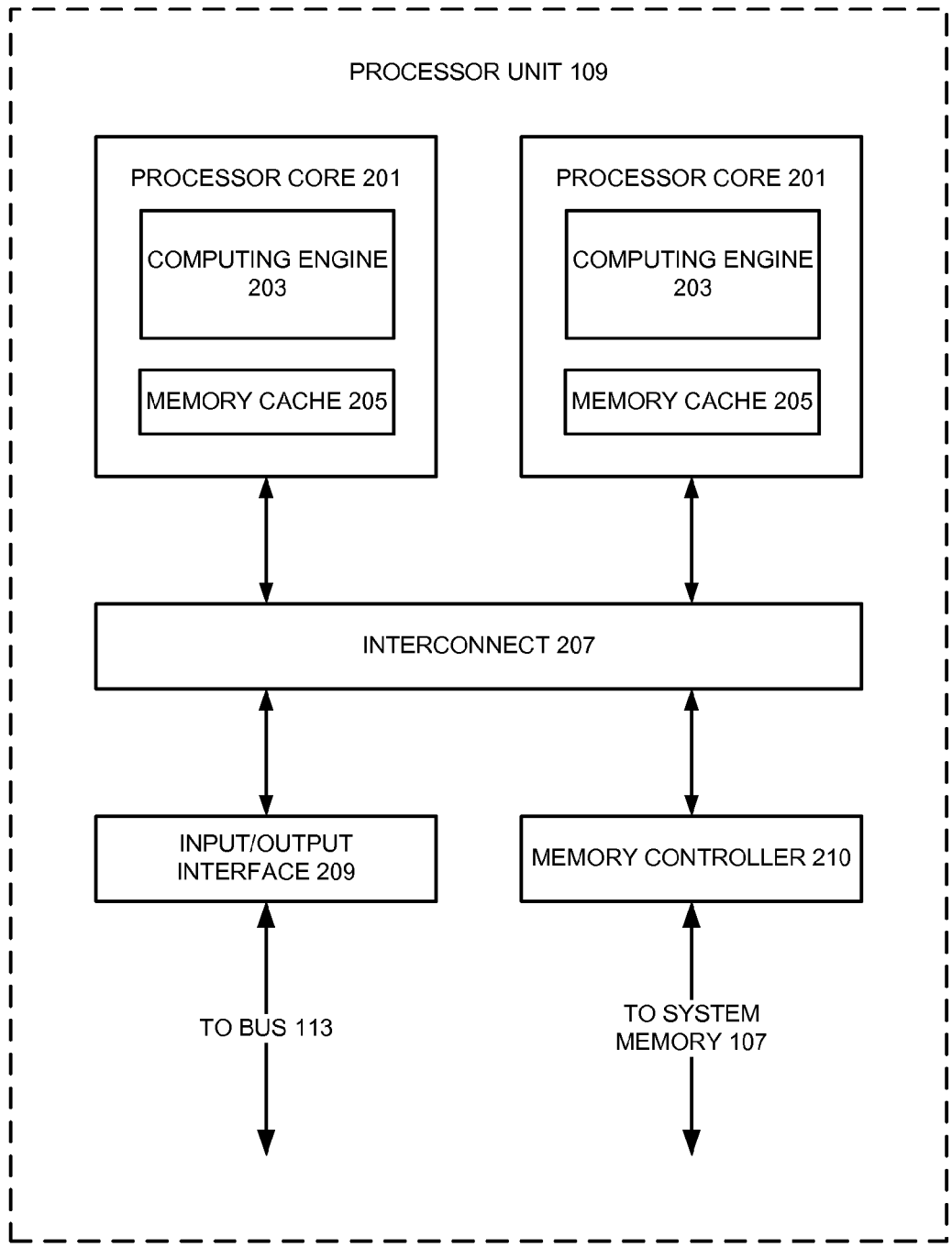

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one or more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Hierarchical Organization of Data

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, sometimes referred to as "modules." Thus, for a microprocessor or flash memory design, all of the transistors making up a memory circuit for storing a single bit may be categorized into a "single-bit memory" module. Rather than having to enumerate each transistor individually, the group of transistors making up a single-bit memory circuit can thus collectively be referred to and manipulated as a single unit. Similarly, the design data describing a larger "16-bit memory register" circuit can be categorized into a single module. This higher level "register module" might then include sixteen single-bit memory modules, together with the design data describing other miscellaneous circuitry, such as an input/output circuit for transferring data into and out of each of the bit memory modules. Similarly, the design data describing a 128 kB memory array can then be concisely described as a combination of only 64,000 register modules, together with the design data describing its own miscellaneous circuitry, such as an input/output circuit for transferring data into and out of each of the register modules.

By categorizing microcircuit design data into hierarchical modules, large data structures can be processed more quickly and efficiently. For example, a circuit designer typically will analyze a design to ensure that each circuit feature described in the design complies with design rules specified by the foundry that will manufacture microcircuits from the design. With the above example, instead of having to analyze each feature in the entire 128 kB memory array, a design rule check process can analyze the features in a single bit module. The results of the check will then be applicable to all of the single bit modules. Once it has confirmed that one instance of the single bit modules complies with the design rules, the design rule check process then can complete the analysis of a register module simply by analyzing the features of its additional miscellaneous circuitry (which may itself be made of up one or more hierarchical modules). The results of this check will then be applicable to all of the register modules. Once it has confirmed that one instance of the register modules complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of modules making up the data structure.

Compilation of an Register Transfer Level (RTL) Design into a Model

As known to those of ordinary skill in the art, the process of converting a first description of a circuit design to a second description of the circuit design is sometimes referred to as "compilation." For example, many designers will define a circuit design in a high-level description format, such as a register transfer level (RTL) description of a circuit design. In order to analyze the circuit design using an emulator, however, the circuit design will be compiled into a second circuit description or "model" that can be implemented on an emulator (i.e., a binary image that configures the emulator hardware). The model will describe a set of "primitive" components and their interconnections that the emulator can use to implement the functionality described in the RTL description. The specific primitive elements used in a model will depend upon the type of emulator being used to analyze the circuit design. Those of skill in the art will appreciate that various implementations of the invention may be applied to emulators using a variety of technology with which to emulate a design. As such, where reference to one particular emulator technology is made, it is to be appreciated that this type of technology is not limiting and those of skill in the art will appreciate how to modify the illustrative implementations presented for various other technologies available.

With conventional circuit designs, an RTL description of the circuit design may have a hierarchical organization, as discussed in detail above. During a compilation process, an RTL design is typically compiled one hierarchical module at a time. Thus, compilation of a high-level module will lead to the instantiation of one or more lower-level modules into the model, each of which in turn will lead to the instantiation of one or more still lower-level modules into the model, and so on for up to, e.g., 20-30 levels, until the lowest level "leaf" modules are instantiated in the model. During a conventional compilation process, once a particular translation of a module into primitive elements for the model has been made, it will be reused (e.g., for each instance of the module in the RTL design).

This reuse of definitions can impact both performance and capacity, however. For example, some instances of a module may occur along a critical path, where the operational delay of the module must fall below a threshold amount in order for the emulated circuit design to operate properly. Still other instances of the same module may occur in large numbers at locations that are not timing sensitive. With these instances, even a small reduction in the size of the compiled design may significantly reduce the area required to emulate the design. More particularly, the amount of resources required to emulate the design may be decreased. As will be discussed in further detail below, various implementations of the invention allow different portions of a circuit design, including different instances of a hierarchical module, to be compiled using different compilation parameter values.

An additional impact of reuse of definitions is that the context of the modules instantiation is not considered when the module is reused. With various implementations of the invention, the context of the module may be analyzed during reuse. For example, constant values on input ports or mutually exclusive values on the input ports of the different instances of a hierarchical module may be determined. Then, based in part upon this determination, different portions of a circuit design may be compiled using different compilation parameter values to achieve better capacity and performance. As indicated above, the various implementations of the invention may be applied across hierarchical boundaries in the circuit design.

Compilation Tool

Figure 3:
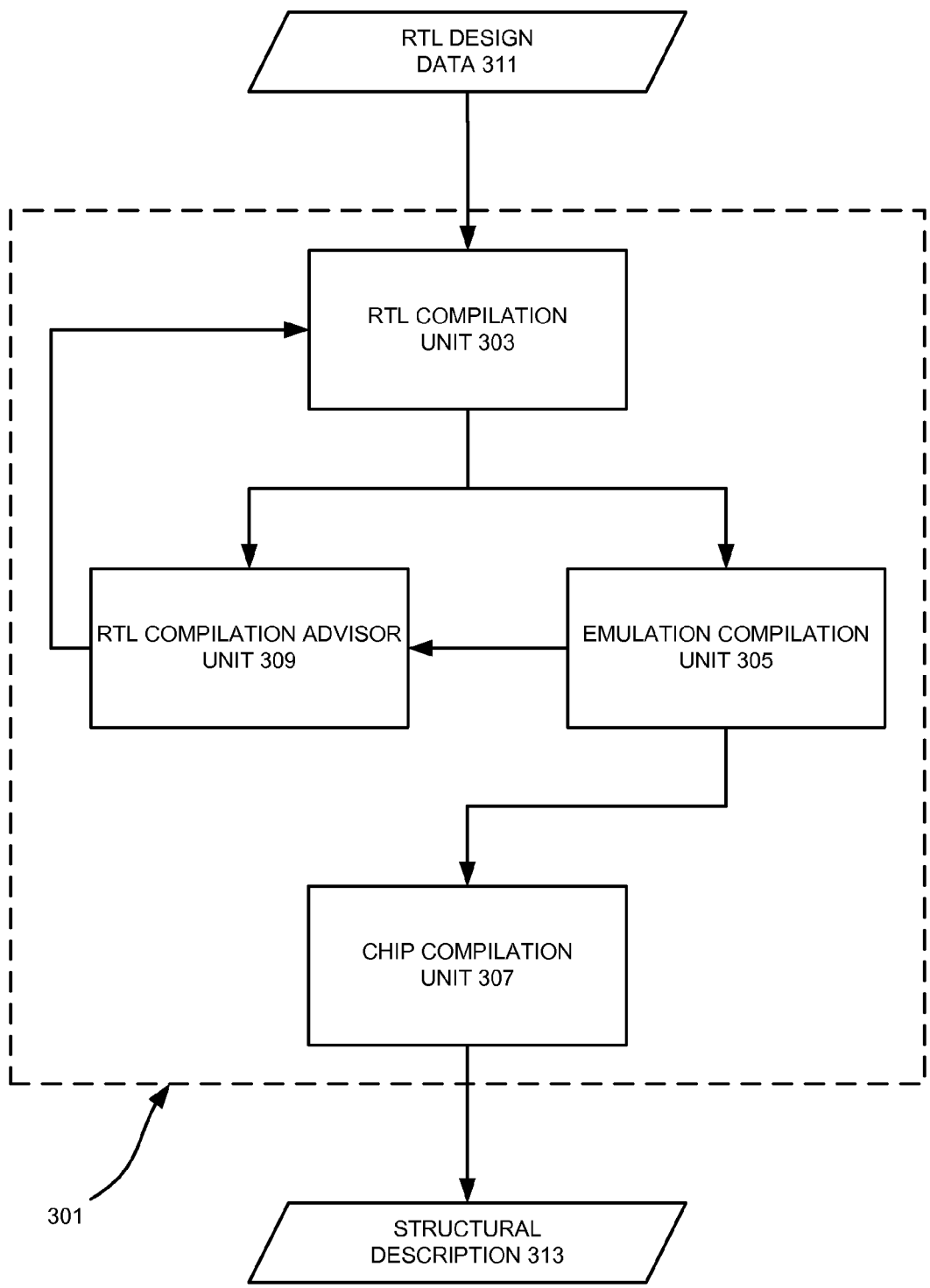
FIG. 3 illustrates an example of a compilation system that may be employed to compile a first design description into a second design description according to various embodiments of the invention.

FIG. 3 illustrates an example of a compilation tool 301 that may be employed to compile a first design description into a second design description according to various embodiments of the invention. As seen in this figure, the compilation tool 301 includes an RTL compilation unit 303, an emulation compilation unit 305, and a chip compilation unit 307. The compilation tool 301 also includes an RTL compilation advisor unit 309.

As will be appreciated by those of ordinary skill in the art, the RTL compilation unit 303 receives an RTL level representation of a design as input. This type of design description typically will be in the form of a hardware description languages (HDL), such as Verilog, VHDL, or System Verilog. With some circuit designs, the description of the design will have a hierarchical organization, as discussed in detail above. The RTL compilation unit 303 is configured to compile a provided RTL level design description into a functionally equivalent hierarchical design description made up of the primitive elements that will be used in a hardware emulator to emulate the circuit.

The emulation compilation unit 305 receives the hierarchical model design description produced by the RTL compilation unit 303. It then partitions the model design to correspond with the various programmable circuit devices (e.g., FPGAs) available in the emulation device, determines where the various design components will be placed in the various programmable circuit devices available in the emulation device, and determines how interconnections between those components will be routed. The chip compilation unit 307 programs the various programmable circuit devices available in the emulation device to implement the circuit description provided by the emulation compilation unit 305.

As previously noted, various examples of the invention may be implemented using a computing system, such as the computing system 101 illustrated in FIGS. 1 and 2. Accordingly, one or more components of each of the RTL compilation unit 303, the emulation compilation unit 305, the chip compilation unit 307 and the RTL compilation advisor unit 309 may be implemented by one or more processors in a computing system, such as the computing system 101, executing software instructions, by software instructions stored on a computer readable medium (such as the memory 107 or the memory 119) for execution, or by some combination of both. It also should be appreciated that, while the RTL compilation unit 303, the emulation compilation unit 305, the chip compilation unit 307 and the RTL compilation advisor unit 309 are shown as separate units in FIG. 3, a single computing system may be used to implement two or more of these modules at different times, or components of two or more of these modules at different times. Still further, while the RTL compilation unit 303, the emulation compilation unit 305, the chip compilation unit 307 and the RTL compilation advisor unit 309 are illustrated as separate units, it should be appreciate that alternate implementations of the inventions may employ different combinations of the components of these units. For example, with some alternate implementations of the invention, a unit may incorporate some components of both the RTL compilation unit 303 and the emulation compilation unit 305.

The operation of the compilation tool 301 will be explained with reference to the flowchart illustrated in FIG. 4. Initially, in operation 401, the RTL compilation unit 303 receives RTL design data 311. The RTL design data 311 may be in any desired design format, such as VHDL or Verilog. As used herein, the term "design" is intended to encompass data describing an entire integrated circuit device. This term also is intended to encompass a smaller group of data describing one or more components of an entire microdevice, however, such as a section of an integrated circuit device. Still further, the term "design" also is intended to encompass data describing more than one circuit device, such as data to be used to simultaneously form multiple circuits on a single wafer, such as, for example, a System-on-Chip (SOC) device.

Next, in operation 403, the RTL compilation unit 303 compiles the RTL design data into model design data for use by an emulator. With various examples of the invention, the RTL compilation unit 303 may initially employ any desired compilation parameter values to compile the RTL design data. The initial compilation parameter values may be default compilation parameter values, user-defined compilation parameter values, or some combination thereof.

The emulation compilation unit 305 receives the hierarchical model design data produced by the RTL compilation unit 303, and, in operation 405 further compiles it for use by an emulator. For example, with various implementations of the invention, the emulation compilation unit 305 will partition the model design provided by the RTL compilation unit 303 to correspond with the various programmable circuit devices available in the emulation device. It also will determine where the various design components will be placed in the various programmable circuit devices available in the emulation device, and how interconnections between those components will be routed.

In operation 407, the RTL compilation advisor unit 309 analyzes data provided by the RTL compilation unit 303 and the emulation compilation unit 305 to generate a set of recommended compilation parameter values. The operation of the RTL compilation advisor unit 309 will be discussed in more detail below.

Next, in operation 409, the compilation tool 301 determines whether the RTL compilation process is completed. As will be appreciated by those of ordinary skill in the art, any desired criteria can be used to determine if the RTL compilation is completed. For example, with some implementations of the invention, the compilation tool 301 may determine that the RTL compilation is completed after a predefined number of iterations of the RTL compilation process. Still other implementations of the invention may determine that the RTL compilation is completed when the RTL compilation advisor unit 309 generates recommended compilation parameter values that are substantially the same as previously-generated recommended compilation parameter values or initial compilation parameter values, (i.e., the compilation parameter values used in the preceding RTL compilation process). Still other implementations of the invention may determine that the RTL compilation is complete when the RTL compilation advisor unit 309 generates no recommended compilation parameter values (i.e., the RTL compilation advisor unit 309 concludes that it cannot improve upon the compilation parameter values used in the preceding RTL compilation process).

If the compilation tool 301 determines that the RTL compilation is not yet completed, then the operation flow returns to operation 403 for another compilation of the RTL design data. In this subsequent operation, however, the RTL compilation unit 303 employs the recommended compilation parameter values that have just been generated by the RTL compilation advisor unit 309. If the compilation tool 301 determines that the RTL compilation is completed, then in operation 411 the chip compilation unit 307 programs the various programmable circuit devices available in the emulation device to implement the circuit description described by the RTL design data.

Figure 4A:
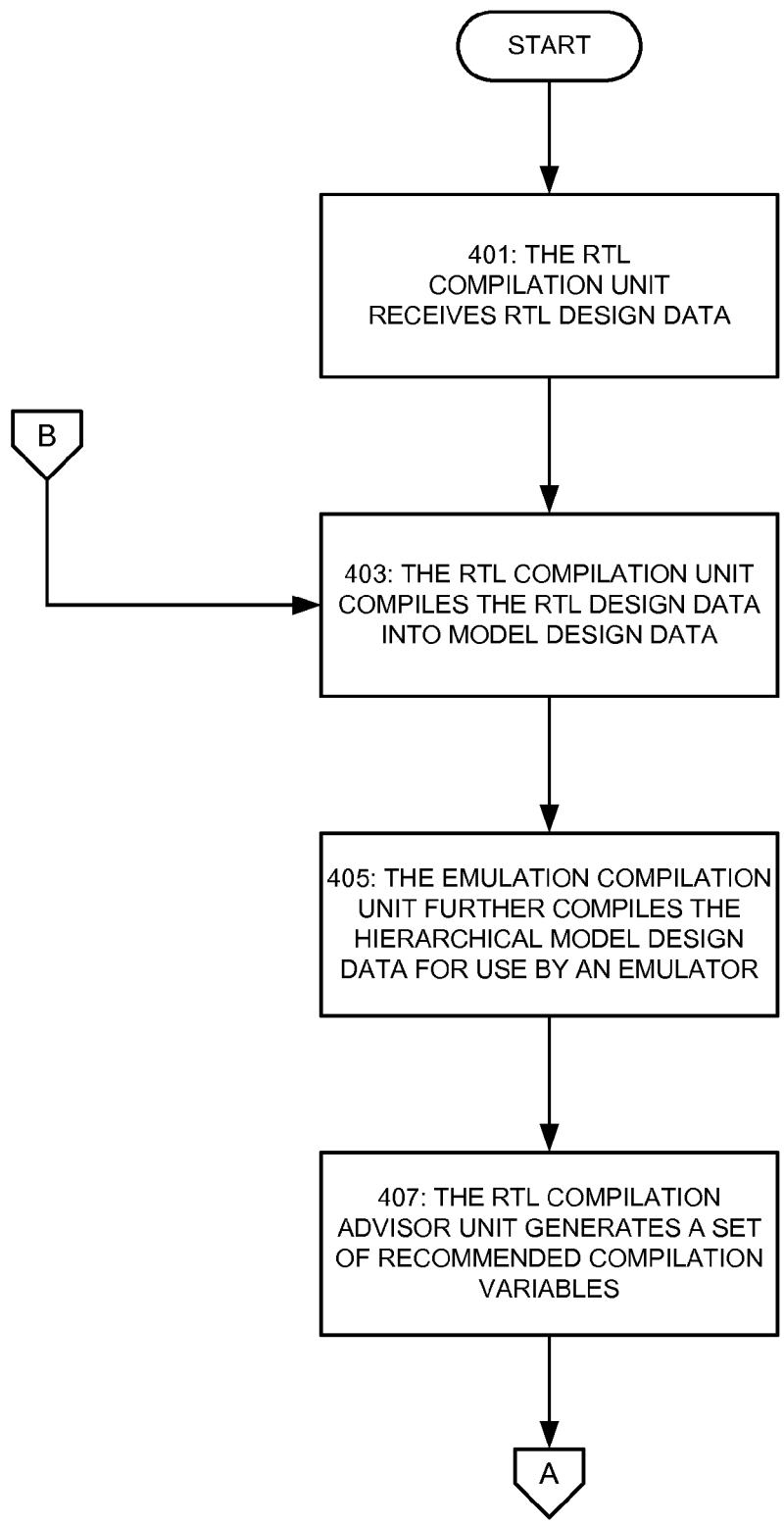
FIGS. 4A and 4B illustrate a flowchart showing the operation of a compilation system according to various embodiments of the invention.
Figure 4B:
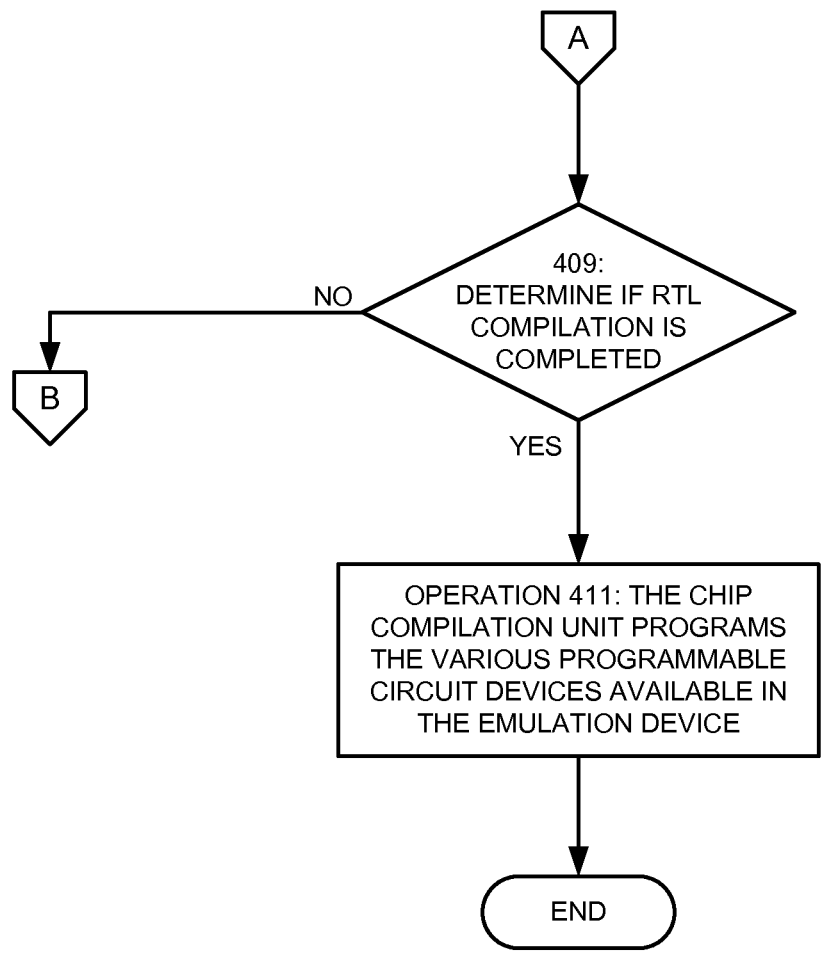

While a specific order of operations is illustrated in FIGS. 4A and 4B, it should be appreciated that alternate implementations of the invention may employ a different order of operations. For example, with some implementations of the invention, the determination of whether the RTL compilation is completed may be made before the RTL compilation advisor unit 309 generates recommended compilation parameter values. Alternately or additionally, with some implementations of the invention the RTL compilation advisor unit 309 may not employ data provided by the emulation compilation unit 305. With these implementations of the invention, the RTL compilation advisor unit 309 may generate the recommended compilation parameter values concurrently with or even before the emulation compilation unit 305 further compiles the RTL design data. Still further, with these implementations, the determination of whether the RTL compilation is completed or not may be made before the operation of the emulation compilation unit 305. As such, the operation of the emulation compilation unit 305 may be excluded from multiple iterations of the compilation process as described above.

It also should be appreciated, that while the operation of the compilation tool 301 has been described with reference to the operation flow shown in FIGS. 4A and 4B, still other operation flows may be employed with the compilation tool 301 according to various embodiments of the invention. Further, the operation flow shown in FIGS. 4A and 4B may be employed with other compilation tools according to still other various embodiments of the invention.

Compilation Advisor Tool

Figure 5:
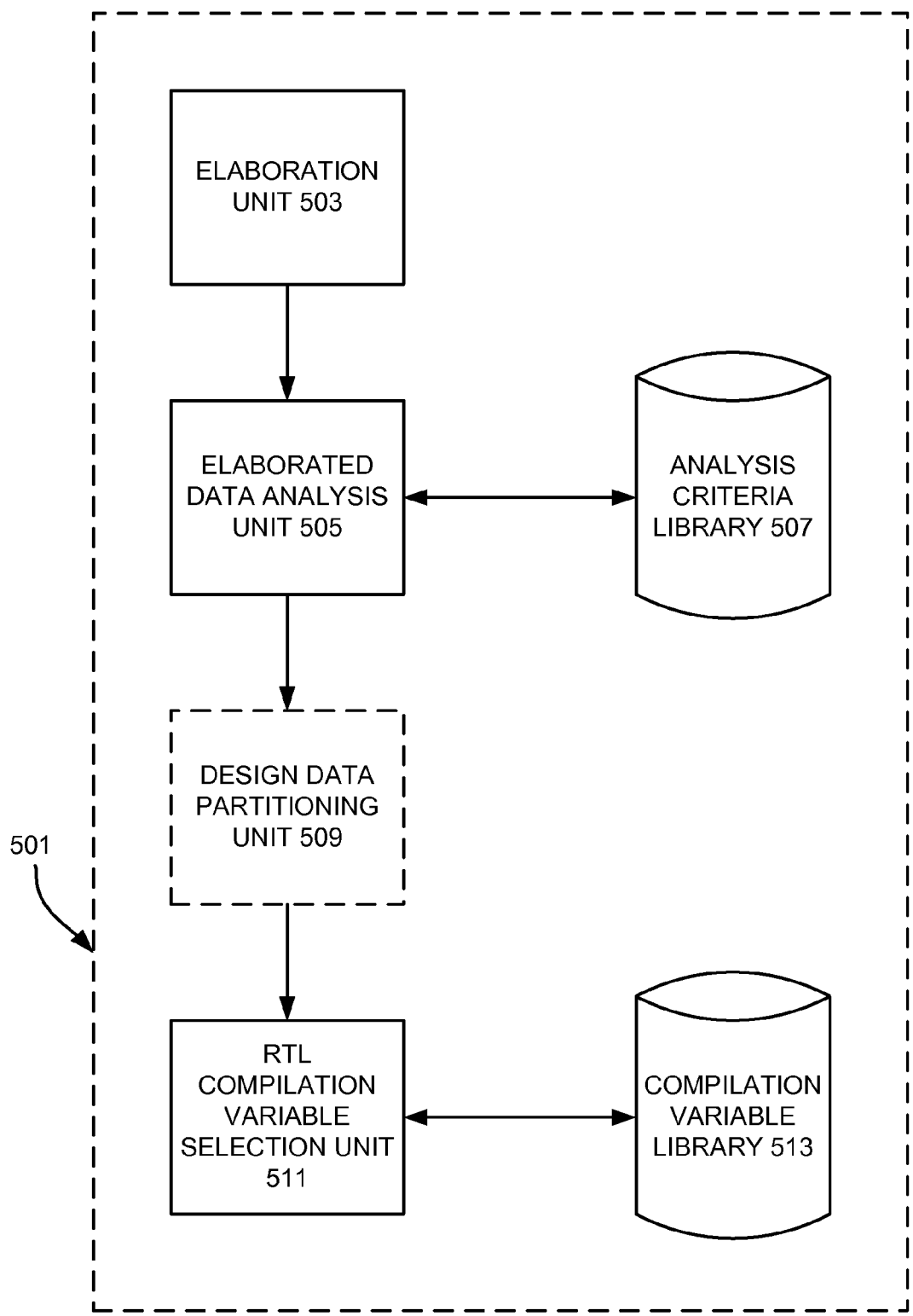
FIG. 5 illustrates an example of a compilation advisor that may be implemented according to various embodiments of the invention.

As previously noted, the compilation tool 301 includes an RTL compilation advisor unit 309. FIG. 5 illustrates an RTL compilation advisor tool 501 that may be used to implement the RTL compilation advisor unit 309 according to various examples of the invention. As seen in this figure, the RTL compilation advisor tool 501 includes an elaboration unit 503, an elaborated data analysis unit 505, and an analysis criteria library 507. The RTL compilation advisor tool 501 also (optionally) includes a design data partitioning unit 509, a RTL compilation variable selection unit 511, and a compilation variable library 513.

As previously noted, various examples of the invention may be implemented using a computing system, such as, for example, the computing system 101 illustrated in FIGS. 1 and 2. Accordingly, one or more components of each of the elaboration unit 503, the elaborated data analysis unit 505, the design data partitioning unit 509, and the RTL compilation variable selection unit 511 may be implemented by one or more processors in a computing system (e.g. the computing system 101) executing software instructions, by computer executable software instructions stored on a computer readable medium (e.g. the memory 107 or the memory 119), or by some combination of both. Similarly, one or more components of the analysis criteria library 507 and the compilation variable library 513 may be implemented using one or more computer-readable medium in a computing system, such as the computing system 101, to store the data for the library.

It also should be appreciated, that while the elaboration unit 503, the elaborated data analysis unit 505, the design data partitioning unit 509, and the RTL compilation variable selection unit 511 are shown as separate units in FIG. 5, a single computing system may be used to implement two or more of these modules at different times, or components of two or more of these modules at different times. Still further, while the elaboration unit 503, the elaborated data analysis unit 505, the design data partitioning unit 509, and the RTL compilation variable selection unit 511 are illustrated as separate units, it should be appreciate that alternate implementations of the inventions may employ different combinations of the components of these units. Likewise, while the analysis criteria library 507 and the compilation variable library 513 are shown as separate units in FIG. 5, a single storage system may be used to implement two or more of these modules at different times, or components of two or more of these modules at different times. Still further, while the analysis criteria library 507 and the compilation variable library 513 are illustrated as separate units, it should be appreciate that alternate implementations of the inventions may employ different combinations of the components of these units.

Figure 6A:
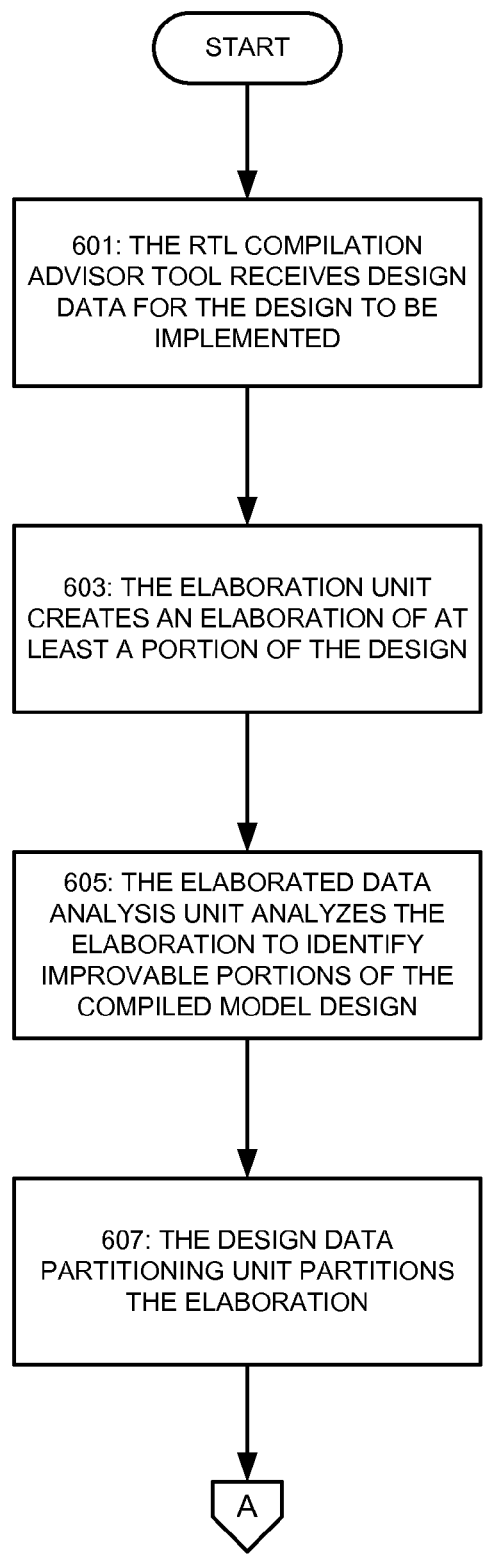
FIGS. 6A and 6B illustrate a flowchart showing the operation of a compilation advisor unit according to various embodiments of the invention.
Figure 6B:
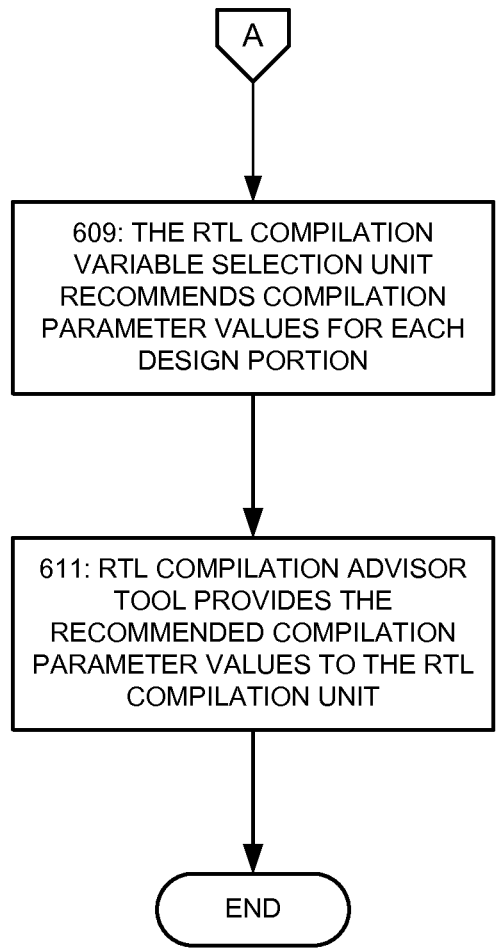

The operation of the compilation tool 301 will be explained with reference to the flowchart illustrated in FIGS. 6A and 6B. Initially, in operation 601, the RTL compilation advisor tool 501 receives design data for the design to be implemented. With various implementations of the invention, for example, RTL compilation advisor tool 501 may receive a structural design netlist for the design from the RTL compilation unit. As will be appreciated by those of ordinary skill in the art, the structural design netlist will contain the primitive components for the compiled modules of the hierarchical design, as well as their interconnections. With still other implementations of the invention, however, the RTL compilation advisor tool 501 may receive the original RTL design data, and perform its own RTL compilation of the original RTL design data to obtain a structural design netlist of compiled modules for the design.

Next, using the structural design netlist, the elaboration unit 503 creates an elaboration of at least a portion of the design in operation 603. As previously noted, the elaboration provides a simple description of the components of the circuit to be implemented. For example, if the design will be implemented on an emulator, then the elaboration may describe the primitive components that will be used for the emulation model, along with the interconnections between the primitive components in the elaboration. With some implementations, the elaboration will be a global elaboration of the entire design. With still other implementations, however, the elaboration may be for only a portion of the design.

Typically, the elaboration will represent two or more hierarchical modules from the compiled design in a "flat" manner. That is, the elaboration typically will flatten two or more separate compiled hierarchical modules into one description of primitive components and their interconnects, so that the primitive components corresponding to the compiled hierarchical modules are interconnected across hierarchical boundaries. Also, according to various examples of the invention, the elaboration will note which primitive components and interconnects correspond to which hierarchical modules in the compiled model design. As will be discussed in more detail below, this allows the RTL compilation advisor tool 501 to generate recommended compilation parameter values for specific modules in the RTL design data.

In operation 605, the elaborated data analysis unit 505 analyzes the elaboration to identify portions of the compiled model design for which the compilation potentially can be improved in some way. More particularly, with some implementations of the invention, the elaborated data analysis unit 505 reviews the elaboration to identify portions of the compiled model design that correspond to heuristics stored in the analysis criteria library 507. The analysis may be a global analysis of the entire elaboration, a local analysis of specific portions of the elaboration, or some combination of both. Also, with various embodiments of the invention, the potential improvement can be a potential increase to the performance of the circuit that will be implemented from the compiled design data, a potential reduction in the size of the circuit that will be implemented from the compiled design data (thereby increasing the capacity of the programmable integrated circuit that will implement the compiled design data), or some combination of both. Still further, a potentially improvable design portion may be a portion of the design data where a specific improvement can be implemented. Alternately, a potentially improvable design portion may be a portion of the design data where, if an improvement is possible, it would significantly improve the operation or implementation of the circuit described in the design data. Accordingly, it should be appreciated that various embodiments of the invention may employ any desired heuristics for identifying potentially improvable portions of the compiled design data.

For example, with some implementations of the invention, the elaborated data analysis unit 505 may perform a global analysis of the compiled model design may to identify "unreachable" areas within the design. These so called, "deadlogic" areas within the design may be optimized differently than other areas of the design. Still further, with various embodiments of the invention, the elaborated data analysis unit 505 will identify critical paths in the compiled design data. Even further still, in various implementations, the elaborated data analysis unit 505 will identify capacity critical modules in the compiled design and their associated memory logic elements. As indicated above, with various implementations of the invention, these analysis operations performed by the analysis unit 505 may cross one or more hierarchical boundaries in the circuit design.

In operation 607, the design data partitioning unit 509 partitions the elaboration. Typically, the design data partitioning unit 509 partitions the elaboration based upon the potential improvements to the compiled model design identified by the elaborated data analysis unit 505. For example, if the elaborated data analysis unit 505 identified a critical path in the elaboration, then the design data partitioning unit 509 may partition the instances of the compiled module or modules that include that critical path into an identifiable set of module or modules instances, separate from other instances of that module or modules. Similarly, if the elaborated data analysis unit 505 identified a region of the elaboration that included a high density of memory devices, then the design data partitioning unit 509 may partition the instances of the compiled module or modules that correspond to that region into an identifiable set of module or modules instances, separate from other instances of that module or modules.

The RTL compilation variable selection unit 511 selects these recommended compilation parameter values by analyzing the focus area to investigate compilation parameter value recommendations. Then an approximation of the actual impact of the parameter value when it will be passed to the compilation unit 303 during operation 611 is made. For example, under various implementations of the invention, a focus circuit area around a critical path may be analyzed, subsequently, the variable selection unit 511 will compare the impact of various compilation parameter values, such as, for example, retiming, path based decomposition, technology mapping, etc., and then choose which compilation parameter values are to be passed to the compilation unit 303 in operation 611. With some implementations, the variable selection unit 511 performs a cost benefit analysis as part of selecting which compilation parameter values to select. In another example, under various implementations of the invention, the compilation variable selection unit 511 will analyze capacity critical design partitions with a focus to identify constant or mutually exclusive values flowing into the partition. After which a cost benefit analysis of their impact on capacity critical compilation parameters, such as, mapping to memory logic elements, capacity driven logic decomposition and mapping, etc., and then select the compilation parameter values to be passed to the compilation unit 303 in operation 611.

Next, in operation 609, the RTL compilation variable selection unit 511 selects one or more recommended compilation parameter values for each design portion partitioned by the design data partitioning unit 509.

The RTL compilation advisor tool 501 then provides the recommended compilation parameter values to the RTL compilation unit 303 in operation 611.

As will be appreciated by those of skill in the art, various goals are desired with respect to each compilation or emulation of a circuit design. For example, as detailed above, it may be desired that the compiled circuit emulate quicker at the expense of some other goal. With some implementations, the RTL compilation unit 303 in operation 611 produces results consistent with the cost benefit analysis done by the variable selection unit 511. As a result, the various desired compilation goals may be attained.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A computer implemented method of compiling a circuit design for emulation in an emulator, comprising:
    elaborating a first abstract description of a circuit design to produce an elaboration of at least a portion of the circuit design;
    analyzing the elaboration to identify compilation parameter values appropriate for compiling the first abstract description of the circuit design into a second abstract description of the circuit design; and
    compiling the first abstract description of the circuit design into the second abstract description of the circuit design using the identified compilation parameter values.

2. The method recited in claim 1, wherein the first abstract description of the circuit design includes hierarchically organized module descriptions.

3. The method recited in claim 2, wherein the elaboration includes a reference for each module occurrence to a corresponding module description and the elaboration references modules from at least two hierarchical levels.

4. The method recited in claim 3, wherein the analyzing the elaboration includes:
    identifying a first set of compilation parameter values for a first occurrence of a first module in the first abstract description; and
    identifying a second set of compilation parameter values for a second occurrence of the first module in the first abstract description.

5. The method recited in claim 1, wherein the elaboration is a global elaboration for an entirety of the first abstract description of the circuit design.

6. The method recited in claim 1, wherein the compilation parameter values include at least one compilation algorithm.

7. The method recited in claim 1, wherein the compilation parameter values include a process effort amount for a compilation algorithm or a design improvement technique.

8. The method recited in claim 1, wherein the compilation parameter values include at least one design improvement technique.

9. The method recited in claim 8, wherein the analyzing the elaboration includes selecting one or more improvement techniques for improving an operational performance of an implementation of the second abstract description of the circuit design.

10. The method recited in claim 8, wherein the analyzing the elaboration includes selecting one or more improvement techniques for improving a capacity of an implementation of the second abstract description of the circuit design.

11. The method recited in claim 1, wherein the second abstract description includes:
    a plurality of primitive elements; and
    a plurality of interconnections between the primitive elements.

12. The method recited in claim 11, further comprising programming an emulator based in part upon the second abstract description.

* * * * *